United States Patent
Matsui

(10) Patent No.: US 8,598,931 B2
(45) Date of Patent: Dec. 3, 2013

(54) DELAY CIRCUIT

(75) Inventor: Yoshinori Matsui, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 86 days.

(21) Appl. No.: 13/208,976

(22) Filed: Aug. 12, 2011

(65) Prior Publication Data

US 2012/0038406 A1 Feb. 16, 2012

(30) Foreign Application Priority Data

Aug. 13, 2010 (JP) .................................. 2010-181329

(51) Int. Cl.
*H03H 11/26* (2006.01)
(52) U.S. Cl.
USPC .......................................... 327/261; 327/283
(58) Field of Classification Search
USPC ................................................ 327/261, 283
See application file for complete search history.

(56) References Cited

U.S. PATENT DOCUMENTS 7,301,830 B2   11/2007  Takahashi et al.
7,466,609 B2 *  12/2008  Takahashi et al. ............ 365/194

FOREIGN PATENT DOCUMENTS

JP         2003-273712 A       9/2003

* cited by examiner

*Primary Examiner* — John Poos
(74) *Attorney, Agent, or Firm* — Sughrue Mion, PLLC

(57) ABSTRACT

To cancel a delay time that occurs in a delay circuit due to temperature and voltage changes. The delay circuit includes a plurality of first and second inverters that are each composed of an N-channel first transistor and a P-channel second transistor connected in series, and P-channel third transistors that are connected between a first power supply wiring and the input nodes of the second inverters. According to the present invention, the presence of the third transistors cancels characteristic variations of the second transistors included in the respective plurality of inverters even if there are changes in temperature, voltage, etc. Consequently, when temperature, voltage, or the like changes, variations in the amount of delay of the entire delay circuit can be regarded as resulting from characteristic variations of the first transistors.

19 Claims, 10 Drawing Sheets

DELAY CIRCUIT

BACKGROUND OF THE INVENTION

1. Field of the Invention

The present invention relates to a delay circuit, and more particularly to a delay circuit that includes a plurality of delay elements connected in series.

2. Description of Related Art

Semiconductor devices may have a delay circuit for adjusting the timing of a control signal inside. For example, Japanese Patent Application Laid-Open No. 2003-273712 describes an example of using inverters as delay elements, which are connected in series to constitute a delay circuit.

In the case of the delay circuit described in Japanese Patent Application Laid-Open No. 2003-273712, when an input signal changes from a low level to a high level, the odd-numbered inverters output a low level and the even-numbered inverters output a high level. Here, N-channel MOS transistors turn ON in the inverters that output the low level, and P-channel MOS transistors turn ON in the inverters that output the high level. Given 2N stages of inverters, the total delay time is N×Tp+N×Tn, where Tn is the time needed for an N-channel MOS transistor to pull down the inverter output, and Tp is the time needed for a P-channel MOS transistor to pull up the inverter output.

Since the driving capability of a transistor depends on temperature, voltage, and the like, the foregoing values Tn and Tp also vary with temperature and voltage. As a result, the delay time of the entire delay circuit varies with temperature, voltage, etc. Variations in the delay time of the entire delay circuit due to changes in temperature, voltage, and the like include both the variation components of Tn and the variation components of Tp. It is therefore not easy to evaluate variations in the delay time of the entire delay circuit.

For example, a state where the N-channel MOS transistors have a low threshold voltage (perform switching at high speed) will be referred to as nL, and a state where the N-channel MOS transistors have a high threshold voltage (perform switching at low speed) will be referred to as nH. A state where the P-channel MOS transistors have a low threshold voltage (perform switching at high speed) will be referred to as pL, and a state where the P-channel MOS transistors have a high threshold voltage (perform switching at low speed) will be referred to as pH. There are four possible cases of variations in the delay time of the entire delay circuit, including nLpL, nLpH, nHpL, and nHpH.

Consequently, if the output signal of the delay circuit needs to be activated in synchronization with the operation timing of a predetermined circuit, it is difficult to make a change in operation timing occurring in the predetermined circuit due to variations in temperature, voltage, and the like coincide with a change in delay time occurring in the delay circuit due to variations in temperature, voltage, etc.

SUMMARY

In one embodiment, there is provided a semiconductor device comprising: a plurality of delay elements connected in series including odd-numbered and even-numbered delay elements, each of the odd-numbered and even-numbered delay elements including a first transistor of a first conductivity type and a second transistor of a second conductivity type, each of the odd-numbered delay elements driving its output node to a first potential via the first transistor and each of the even-numbered delay elements driving its output node to a second potential via the second transistors when an input signal is activated; and one or more third transistors of the second conductivity type, each of the third transistors driving the output node of an associated one of the odd-numbered delay elements toward the second potential when the input signal is activated.

In another embodiment, there is provided a semiconductor device comprising a plurality of first delay elements and a plurality of second delay elements that are connected alternately, wherein preceding one of the first delay elements has an output node coupled to an input node of subsequent one of the second delay elements, preceding one of the second delay elements has an output node coupled to an input node of subsequent one of the first delay elements, each of the first and second delay elements includes a first transistor of a first conductivity type that is connected between a first power supply wiring and the output node and has a control terminal connected to the input node, and a second transistor of a second conductivity type that is connected between a second power supply wiring and the output node and has a control terminal connected to the input node, and the delay circuit further includes a plurality of third transistors of the second conductivity type each connected between the second power supply wiring and the input node of an associated one of the second delay elements.

In still another embodiment, there is provided a semiconductor device comprising: a plurality of delay elements connected in series via first and second signal lines that are alternately disposed from an input side to an output side, each of the delay elements including a first transistor of a first conductivity type that changes its output node to a first potential and a second transistor of a second conductivity type that changes its output node to a second potential thereby each of the delay elements drives an associated one of the first and second signal lines to one of the first and second potentials so that the first signal lines are driven to the first potential and the second signal lines are driven to the second potential when an input signal is activated; and a plurality of third transistors of the second conductive type each connected to an associated one of the first signal lines, each of the third transistors supplying electric current to the associated one of the first signal lines to drive it toward the second potential.

According to the present invention, the presence of the third transistors cancels characteristic variations of the transistors of the second conductivity type included in the respective plurality of delay elements even if temperature, voltage, and the like vary. Changes in the amount of delay of the entire delay circuit can thus be considered as resulting from characteristic variations of the transistors of the first conductivity type when temperature, voltage, and the like vary.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
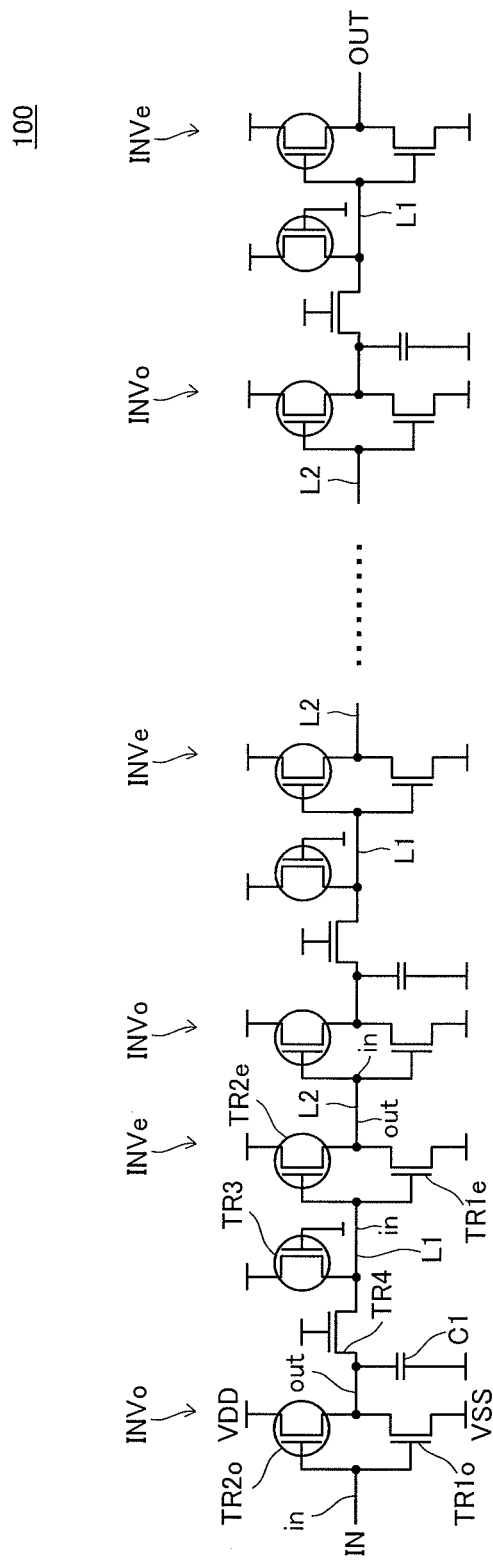
FIG. 1 is a circuit diagram of a delay circuit 100 according to a preferred first embodiment of the present invention.

FIG. 1 is a circuit diagram of a delay circuit 100 according to a preferred first embodiment of the present invention.

As shown in FIG. 1, the delay circuit 100 according to the present embodiment has the configuration that a plurality of inverters INVo and INVe which function as delay elements are alternately connected in series. The inverters INVo are the inverters in odd-numbered stages, and the inverters INVe are the ones in even-numbered stages.

Each inverter INVo or INVe includes an N-channel MOS transistor TR1o or TR1e which is connected between a low-potential power supply wiring VSS and an output node "out", and a P-channel MOS transistor TR2o or TR2e which is connected between a high-potential power supply wiring VDD and the output node "out". The gate electrode, or control terminal, of the transistor TR1o or TR1e and the gate electrode, or control terminal, of the transistor TR2o or TR2e are connected in common to constitute an input node "in".

The output node "out" of the inverter INVo or INVe in the preceding stage is connected to the input node "in" of the inverter INVo or INVe in the subsequent stage. More specifically, the output node "out" of the inverter INVo in an odd-numbered stage and the input node "in" of the inverter INVe in an even-numbered stage are connected with a signal line L1. The output node "out" of the inverter INVe in an even-numbered stage and the input node "in" of the inverter INVo in an odd-numbered stage are connected with a signal line L2.

In the delay circuit 100 according to the present embodiment, P-channel MOS transistors TR3 are connected between the high-potential power supply wiring VDD and the signal lines L1, respectively. The gate electrodes of the transistors TR3 are connected to the low-potential power supply wiring VSS, so that the transistors TR3 are always ON and function as current sources. N-channel MOS transistors TR4 are connected between the transistors TR3 and the output nodes "out" of the inverters INVo, respectively. The gate electrodes of the transistors TR4 are connected to the high-potential power supply wiring VDD, so that the transistors TR4 are always ON and function as resistive elements. In addition, capacitive elements C1 are connected between the output nodes "out" of the inverters INVo in the odd-numbered stages and the low-potential power supply wiring VSS, respectively. Each of the transistors TR4 and each of the resistive elements C1 constitute a time constant circuit.

The basic operation of the delay circuit 100 according to the present embodiment is the same as that of an ordinary inverter chain. More specifically, when an input signal IN changes from a low level (VSS) to a high level (VDD), the odd-numbered inverters INVo output a low level and the even-numbered inverters INVe output a high level. On the other hand, when the input signal IN changes from the high level to the low level, the odd-numbered inverters INVo output a high level and the even-numbered inverters INVe output a low level.

Consider the case where the input signal IN changes from the low level to the high level. In the odd-numbered inverters IVNo, the transistors TR1o turn ON to drive the signal lines L1 to the low level. In the even-numbered inverters INVe, the transistors TR2e turn ON to drive the signal lines L2 to the high level. Since the transistors TR3 are connected to the signal lines L1, respectively, the potential drop of the signal line L1 resulting from the turning ON of the corresponding transistor TR1o is delayed by the current supply from the corresponding transistor TR3. Consequently, the rate of transition of the signal line L1 to the low level depends not only on the driving capability of the N-channel transistor TR1o but also on that of the P-channel transistor TR3.

The signal lines L1 are connected to the gate electrodes of the P-channel transistors TR2e which are included in the inverters INVe in the even-numbered stages, respectively. The rate at which the signal line L2 is driven to the high level by the corresponding transistor TR2e therefore depends not only on the driving capability of the transistor TR2e itself but also on the rate of transition of the corresponding signal line L1 to the low level. The driving capability of the transistor TR2e itself and the rate of transition of the signal line L1 to the low level are inversely proportional to each other. Therefore, characteristic variations of the P-channel MOS transistors due to changes in temperature, voltage, and the like are cancelled out.

More specifically, suppose that the driving capability of the P-channel MOS transistors decreases due to a change in temperature, voltage, etc. In such a case, the lower driving capability of the transistor TR2e reduces the transition rate of the corresponding signal line L2. In the meantime, the lower driving capability of the corresponding transistor TR3 accelerates the transition rate of the corresponding signal lines L1, i.e., the rate of decrease of the gate potential of the transistor TR2e. As a result, the transition rate of the signal line L2 remains the same. Similarly, suppose that the driving capability of the P-channel MOS transistors increases due to a change in temperature, voltage, etc. In such a case, the higher driving capability of the transistor TR2e accelerates the transition rate of the corresponding signal line L2. In the meantime, the enhanced driving capability of the corresponding transistor TR3 lowers the transition rate of the corresponding signal line L1, i.e., the rate of decrease of the gate potential of the transistor TR2e. As a result, the transition rate of the signal line L2 remains the same.

In contrast, characteristic variations of the N-channel MOS transistors due to changes in temperature, voltage, and the like will not be cancelled. Consequently, when temperature, voltage, and the like vary, the time between when the input signal IN changes from the low level to the high level and when the output signal OUT changes from the low level to the high level, i.e., the delay time of the delay circuit 100 is substantially affected only by characteristic variations of the N-channel MOS transistors.

Note that characteristic variations of the P-channel MOS transistors will not be cancelled when the input signal IN changes inversely from the high level to the low level. The delay circuit 100 according to the present embodiment is therefore suitably applied to a circuit where it is important to properly delay the timing of change of the input signal IN from the low level to the high level.

As described above, according to the delay circuit 100 of the present embodiment, it is possible to cancel the influence of characteristic variations of the P-channel MOS transistors when the input signal IN changes from the low level to the high level. It should be appreciated that if the signal that is input to an inverter INVe in an even-numbered stage is defined as the input signal IN, not the one input to an inverter INVo in an odd-numbered stage, then it is possible to cancel the influence of characteristic variations of the P-channel MOS transistors when the input signal IN changes from the high level to the low level.

Figure 2:
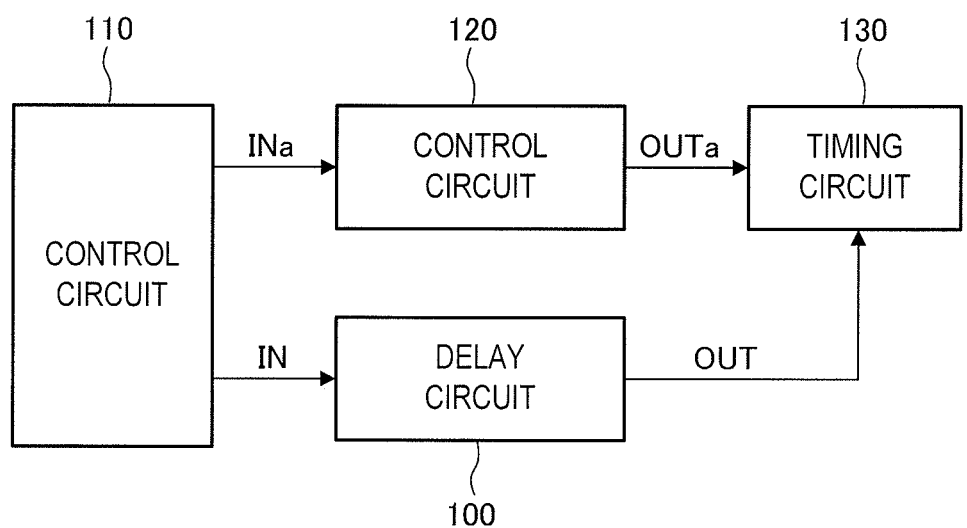
FIG. 2 is an example of a circuit of a semiconductor device to which the delay circuit 100 is suitably applied.

FIG. 2 shows an example of the circuit of a semiconductor device to which the delay circuit 100 according to the present embodiment is suitably applied.

In the example shown in FIG. 2, a control circuit 110 outputs mutually-synchronous input signals IN and INa. The input signal INa is supplied to a control circuit 120, and the input signal IN is supplied to the delay circuit 100. The control circuit 120 starts its operation in synchronization with the input signal INa, and supplies a resulting output signal OUTa to a timing circuit 130. The timing circuit 130 is a circuit that processes the output signal OUTa in synchronization with an output signal OUT of the delay circuit 100. In such a semiconductor device, it is effective to use the delay circuit 100 shown in FIG. 1 if the operating speed of the control circuit 120 is determined by the characteristics of N-channel MOS transistors.

More specifically, when the operating speed of the N-channel MOS transistors decreases due to a change in temperature, voltage, or the like, the output signal OUTa is output from the control circuit 120 at late timing. If the output signal OUT is supplied to the timing circuit 130 at normal timing, the output signal OUT may be activated at so early timing that the output signal OUTa fails to be properly processed in the timing circuit 130. In contrast, if the delay circuit 100 shown in FIG. 1 is used, when the operating speed of the control circuit 120 decreases to delay the output timing of the output signal OUTa, the amount of delay of the delay circuit 100 increases to delay the activation timing of the output signal OUT. Similarly, when the operating speed of the control circuit 120 increases to advance the output timing of the output signal OUTa, the amount of delay of the delay circuit 100 decreases to advance the activation timing of the output signal OUT. Consequently, the timing circuit 130 can properly process the output signal OUTa regardless of changes in temperature, voltage, etc.

Figure 3:
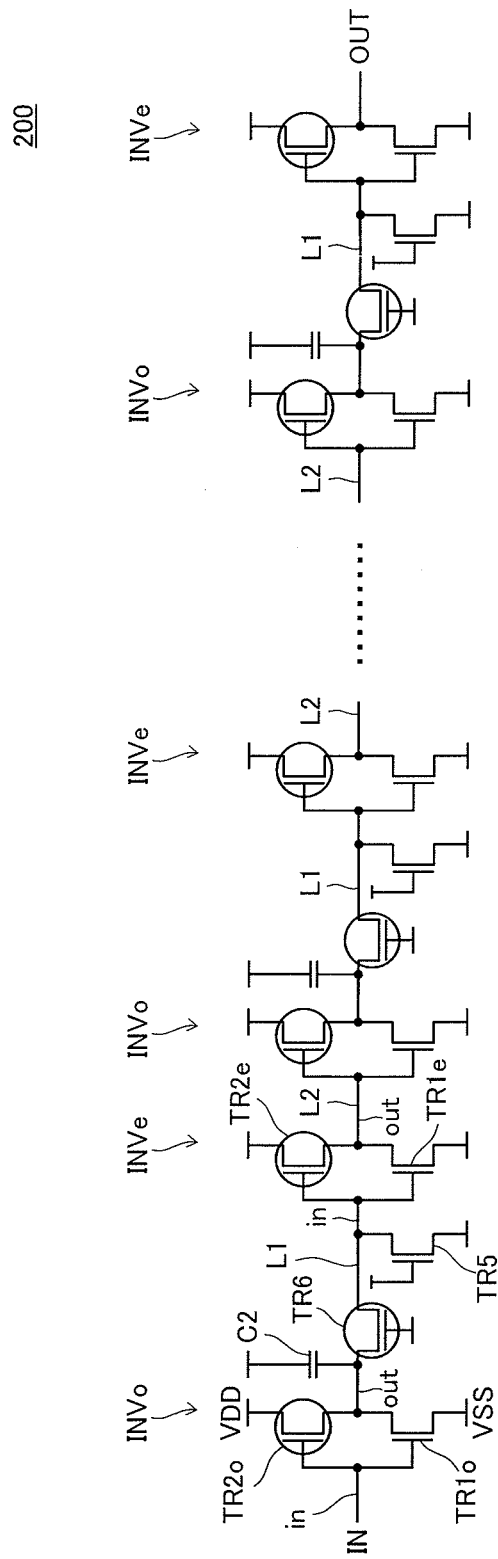
FIG. 3 is a circuit diagram of a delay circuit 200 according to a preferred second embodiment of the present invention.

FIG. 3 is a circuit diagram of a delay circuit 200 according to a preferred second embodiment of the present invention.

As shown in FIG. 3, in the delay circuit 200 according to the present embodiment, N-channel MOS transistors TR5 are connected between the low-potential power supply wiring VSS and the signal lines L1, respectively. The gate electrodes of the transistors TR5 are connected to the high-potential power supply wiring VDD, so that the transistors TR5 are always ON and function as current sources. P-channel MOS transistors TR6 are connected between the transistors TR5 and the output nodes "out" of the inverters INVo, respectively. The gate electrodes of the transistors TR6 are connected to the low-potential power supply wiring VSS, so that the transistors TR6 are always ON and function as resistive elements. In addition, capacitive elements C2 are connected between the output nodes "out" of the inverters INVo in the odd-numbered stages and the high-potential power supply wiring VDD, respectively. Each of the transistors TR6 and each of the capacitive elements C2 constitute a time constant circuits.

The operation of the delay circuit 200 according to the present embodiment will be described for the case where the input signal IN changes from the high level to the low level. In the odd-numbered inverters INVo, the transistors TR2o turn ON to drive the signal lines L1 to the high level. In the even-numbered inverters INVe, the transistors TR1e turn ON to drive the signal lines L2 to the low level. Since the transistors TR5 are connected to the signal lines L1, respectively, the potential increase of the signal line L1 resulting from the turning ON of the corresponding transistor TR2o is delayed by the current supply to the corresponding transistor TR5. Consequently, the rate of transition of the signal line L1 to the high level depends not only on the driving capability of the P-channel transistor TR2o but also on that of the N-channel transistor TR5.

The signal lines L1 are connected to the gate electrodes of the N-channel transistors TR1e which are included in the inverters INVe in the even-numbered stages, respectively. The rate at which the signal line L2 is driven to the low level by the corresponding transistor TR1e therefore depends not only on the driving capability of the transistor TR1e itself but also on the rate of transition of the corresponding signal line L1 to the high level. The driving capability of the transistor TR1e itself and the rate of transition of the signal line L1 to the high level are inversely proportional to each other. Therefore, characteristic variations of the N-channel MOS transistors due to changes in temperature, voltage, and the like are cancelled out. Such a principle is the same as with the delay circuit 100 according to the first embodiment. Redundant description will thus be omitted.

In the present embodiment, characteristic variations of the N-channel MOS transistors will not be cancelled when the input signal IN changes from the low level to the high level. The delay circuit 200 according to the present embodiment is therefore suitably applied to a circuit where it is important to properly delay the timing of change of the input signal IN from the high level to the low level.

As described above, according to the delay circuit 200 of the present embodiment, it is possible to cancel the influence of characteristic variations of the N-channel MOS transistors when the input signal IN changes from the high level to the low level. It should be appreciated that if the signal that is input to an inverter INVe in an even-numbered stage is defined as the input signal IN, not the one input to an inverter INVo in an odd-numbered stage, then it is possible to cancel the influence of characteristic variations of the N-channel MOS transistors when the input signal IN changes from the low level to the high level.

Figure 4:
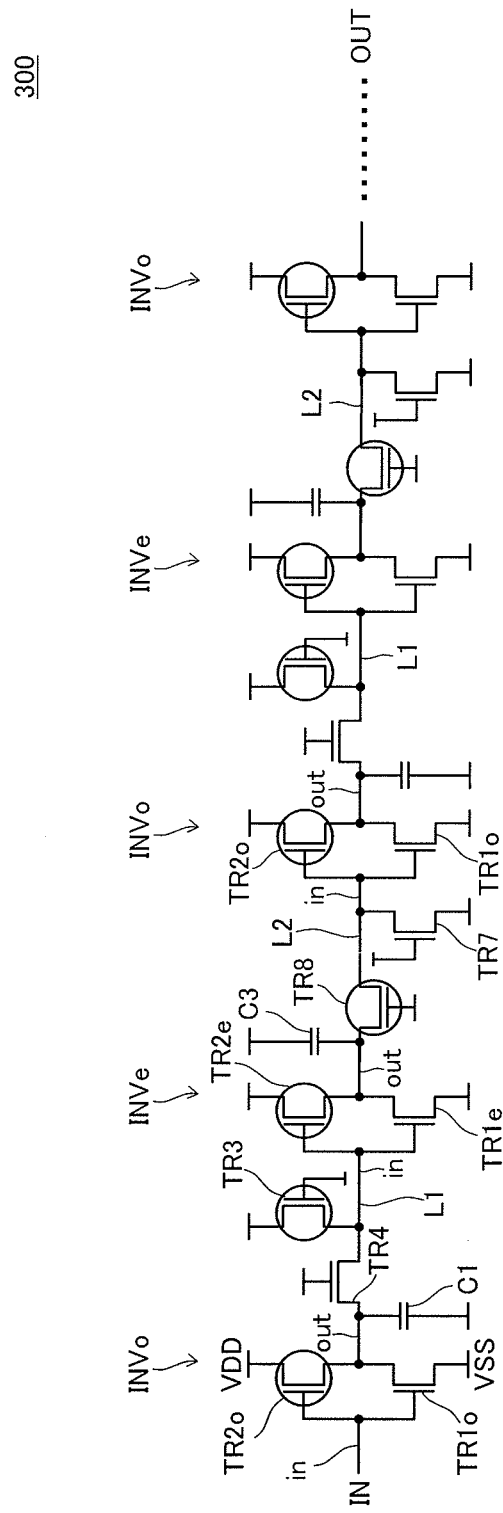
FIG. 4 is a circuit diagram of a delay circuit 300 according to a preferred third embodiment of the present invention.

FIG. 4 is a circuit diagram of a delay circuit 300 according to a preferred third embodiment of the present invention.

As shown in FIG. 4, the delay circuit 300 according to the present embodiment has the configuration that N-channel MOS transistors TR7 are connected between the low-potential power supply wiring VSS and the signal lines L2, respectively, in addition to the configuration of the delay circuit 100 according to the first embodiment. The gate electrodes of the transistors TR7 are connected to the high-potential power supply wiring VDD, so that the transistors TR7 are always ON and function as current sources. P-channel MOS transistors TR8 are connected between the transistors TR7 and the output nodes "out" of the inverters INVe, respectively. The gate electrodes of the transistors TR8 are connected to the low-potential power supply wiring VSS, so that the transistors TR8 are always ON and function as resistive elements. In addition, capacitive elements C3 are connected between the output nodes "out" of the inverters INVe in the even-numbered stages and the high-potential power supply wiring VDD, respectively. Each of the transistors TR8 and each of the capacitive elements C3 constitute a time constant circuit.

The delay circuit 300 according to the present embodiment can provide both the effect described in the first embodiment and the effect described in the second embodiment. More specifically, when the input signal IN changes from the low level to the high level, the N-channel MOS transistors TR1o turn ON in the inverters INVo in the odd-numbered stages, and the P-channel MOS transistors TR2e turn ON in the inverters INVe in the even-numbered stages. Here, characteristic variations of the N-channel MOS transistors TR1o are cancelled by the transistors TR7, respectively. Characteristic variations of the P-channel MOS transistors TR2e are cancelled by the transistors TR3, respectively.

As described above, according to the delay circuit 300 of the present embodiment, it is possible to cancel the influence of characteristic variations of both the N-channel MOS transistors and the P-channel MOS transistors when the input signal IN changes from the low level to the high level. It should be appreciated that if the signal that is input to an inverter INVe in an odd-numbered stage is defined as the input signal IN, not the one input to an inverter INVo in an odd-numbered stage, then it is possible to cancel the influence of characteristic variations of the N-channel MOS transistors and the P-channel MOS transistors when the input signal IN changes from the high level to the low level.

Figure 5:
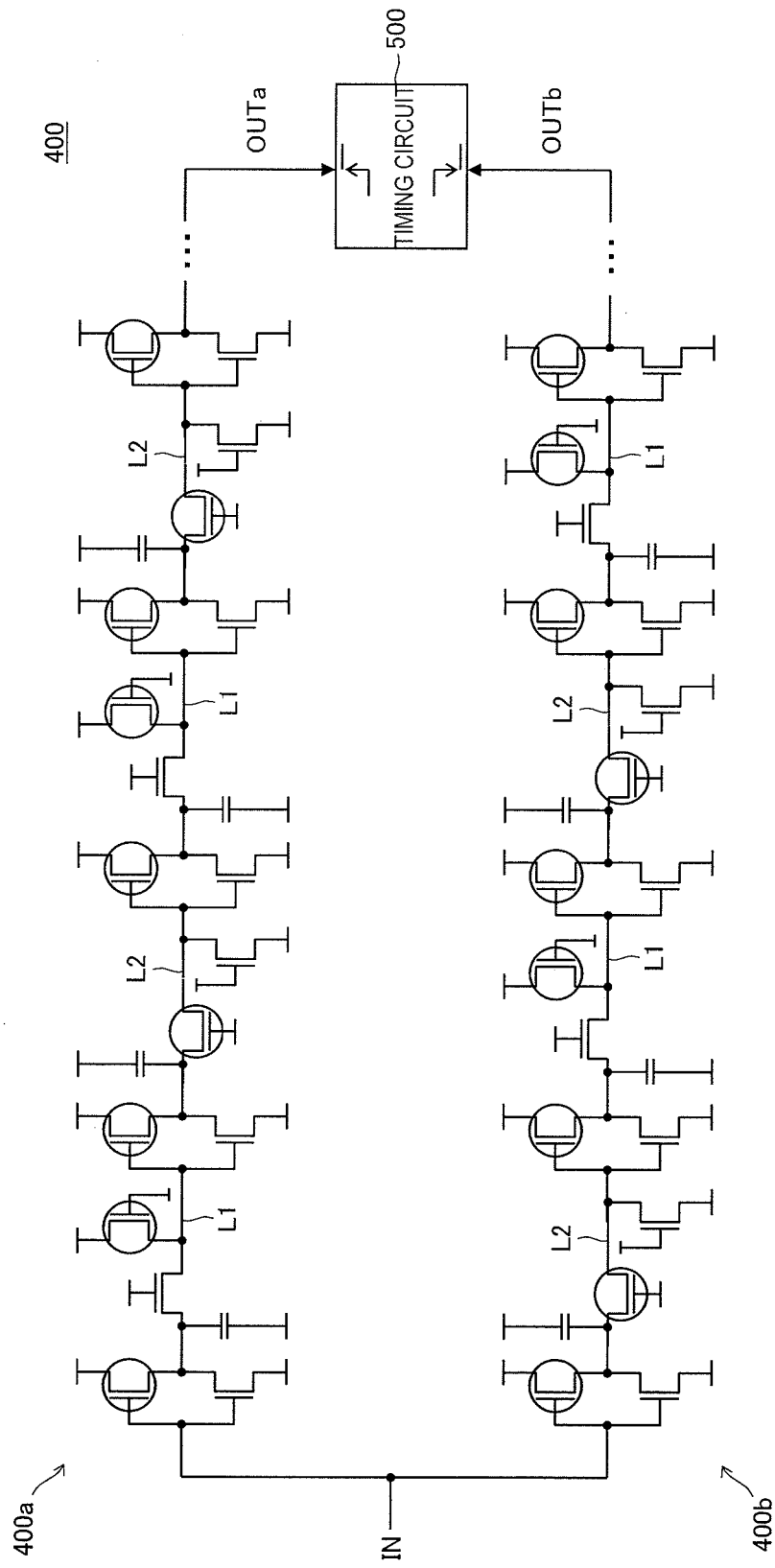
FIG. 5 is a circuit diagram of a delay circuit 400 according to a preferred fourth embodiment of the present invention.

FIG. 5 is a circuit diagram of a delay circuit 400 according to a preferred fourth embodiment of the present invention.

As shown in FIG. 5, the delay circuit 400 according to the present embodiment has the configuration that there are two systems of the delay circuit 300 shown in FIG. 4. The first system of delay circuit 400a is the same circuit as the delay circuit 300 shown in FIG. 4. The second system of delay circuit 400b has a circuit configuration that the odd-numbered stages and even-numbered stages of the delay circuit 300 shown in FIG. 4 change places with each other, i.e., a circuit configuration with one stage shifted.

In the delay circuit 400 according to the present embodiment, the first system of delay circuit 400a outputs an output signal OUTa in which the timing of change of the input signal IN from the low level to the high level is properly delayed. The second system of delay circuit 400b outputs an output signal OUTb in which the timing of change of the input signal IN from the high level to the low level is properly delayed. The output signals OUTa and OUTb are input to a timing circuit 500, which performs a timing control based on the rising edge (or falling edge) of the output signal OUTa and performs another timing control based on the falling edge (or rising edge) of the output signal OUTb. This makes it possible to cancel the influence of characteristic variations of both the N-channel MOS transistors and the P-channel MOS transistors both when the input signal IN changes from the low level to the high level and when the input signal IN changes from the high level to the low level.

Next, a semiconductor device using the delay circuit according to the present invention will be described.

Figure 6:
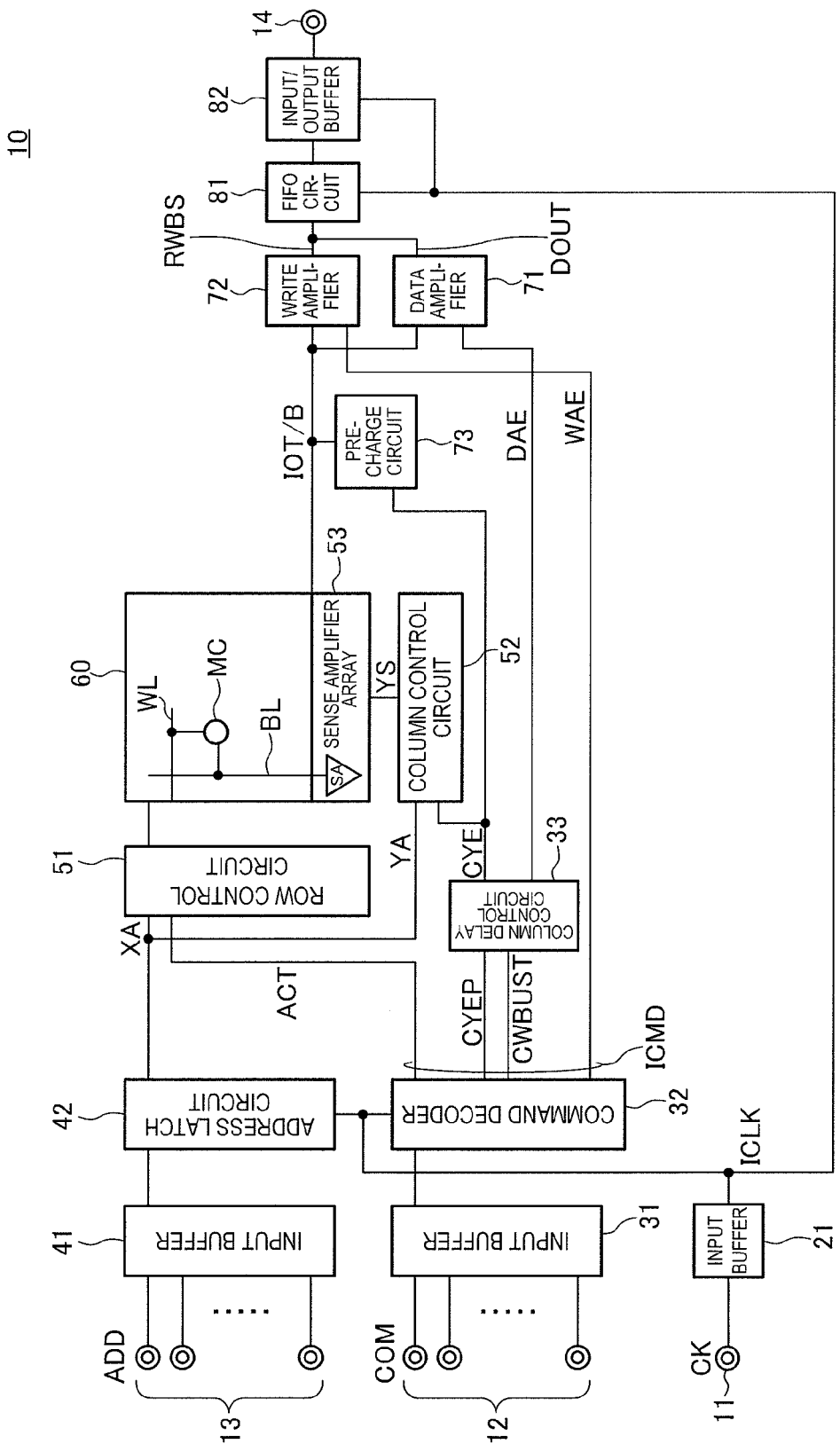
FIG. 6 is a circuit diagram of a semiconductor device 10 according to a preferred fifth embodiment of the present invention.

FIG. 6 is a circuit diagram of a semiconductor device 10 according to a preferred fifth embodiment of the present invention.

As shown in FIG. 6, the semiconductor device 10 according to the present embodiment has at least a clock terminal 11, command terminals 12, address terminals 13, and a data input/output terminal 14 as external terminals.

The clock terminal 11 is a terminal to which a clock signal CK, a synchronous signal, is supplied. The supplied clock signal CK is supplied to an input buffer 21. The input buffer 21 generates an internal clock ICLK and supplies the internal clock ICLK to circuit blocks to be described later.

The command terminals 12 are terminals to which command signals such as a row address strobe signal RAS, a column address strobe signal CAS, a write enable signal WE, and a chip select signal CS are supplied. The command signals are supplied to a command decoder 32 through an input buffer 31. The command decoder 32 retains, decodes, counts, or otherwise processes the command signals in synchronization with the internal clock ICLK to generate various types of internal commands ICMD.

The internal commands ICMD include at least a row control signal ACT, a column control signal CYEP, a read control signal CWBUST, and a write amplifier control signal WAE. The row control signal ACT is a signal to be activated when the command input from outside is an active command. The column control signal CYEP is a signal to be activated when the command input from outside is a read command or a write command. When the command input from outside is a read command, the read control signal CWBUST is also activated. When the command input from outside is a write command, the write amplifier control signal WAE is activated.

The address terminals 13 are terminals to which address signals ADD are supplied. The supplied address signals ADD are supplied to an address latch circuit 42 through an input buffer 41. The address latch circuit 42 is a circuit that latches the address signals ADD in synchronization with the internal clock ICLK. Among the address signals ADD latched in the address latch circuit 42, a row address XA is supplied to a row control circuit 51. A column address YA is supplied to a column control circuit 52.

The row control circuit 51 is a circuit that selects any one of word lines WL included in a memory cell array 60 based on the row address XA. As shown in FIG. 6, the memory cell array 60 includes a plurality of word lines WL and a plurality of bit lines BL which cross each other. Memory cells MC are arranged at the intersections (FIG. 6 shows only one of the word lines WL, one of the bit lines BL, and one of the memory cells MC). The bit lines BL are connected to corresponding sense amplifiers SA in a sense amplifier array 53.

The sense amplifiers SA included in the sense amplifier array 53 are selected by the column control circuit 52 based on the column address YA. Sense amplifier SA selected are connected to a data amplifier 71 and a write amplifier 72 through pairs of input/output lines IOT/B. The data amplifier 71 functions to amplify read data that is read from memory cells through the pairs of input/output lines IOT/B, and supply the amplified data to a read/write bus RWBS. The operation of the data amplifier 71 is controlled by a data amplifier control signal DAE. The write amplifier 72 functions to supply write data that is supplied through the read/write bus RWBS, directed from outside to memory cells, to the pairs of input/output lines IOT/B. The operation of the write amplifier 72 is controlled by the write amplifier control signal WAE. A precharge circuit 73 is connected to the pairs of input/output lines IOT/B. The operation of the precharge circuit 73 is controlled by a column control signal CYE. The data amplifier control signal DAE and the column control signal CYE are generated by a column delay control circuit 33. The column delay control circuit 33 will be described in detail later.

The read/write bus RWBS is connected to a FIFO circuit 81. The FIFO circuit 81 is a circuit that performs parallel-to-serial conversion on read data and serial-to-parallel conversion on write data. As a result, pieces of read data that are read in parallel through the read/write bus RWBS are serially output through an input/output buffer 82 and the data input/output terminal 14. Pieces of write data that are serially input through the data input/output terminal 14 and the input/output buffer 82 are supplied to the read/write bus RWBS in parallel.

Figure 7:
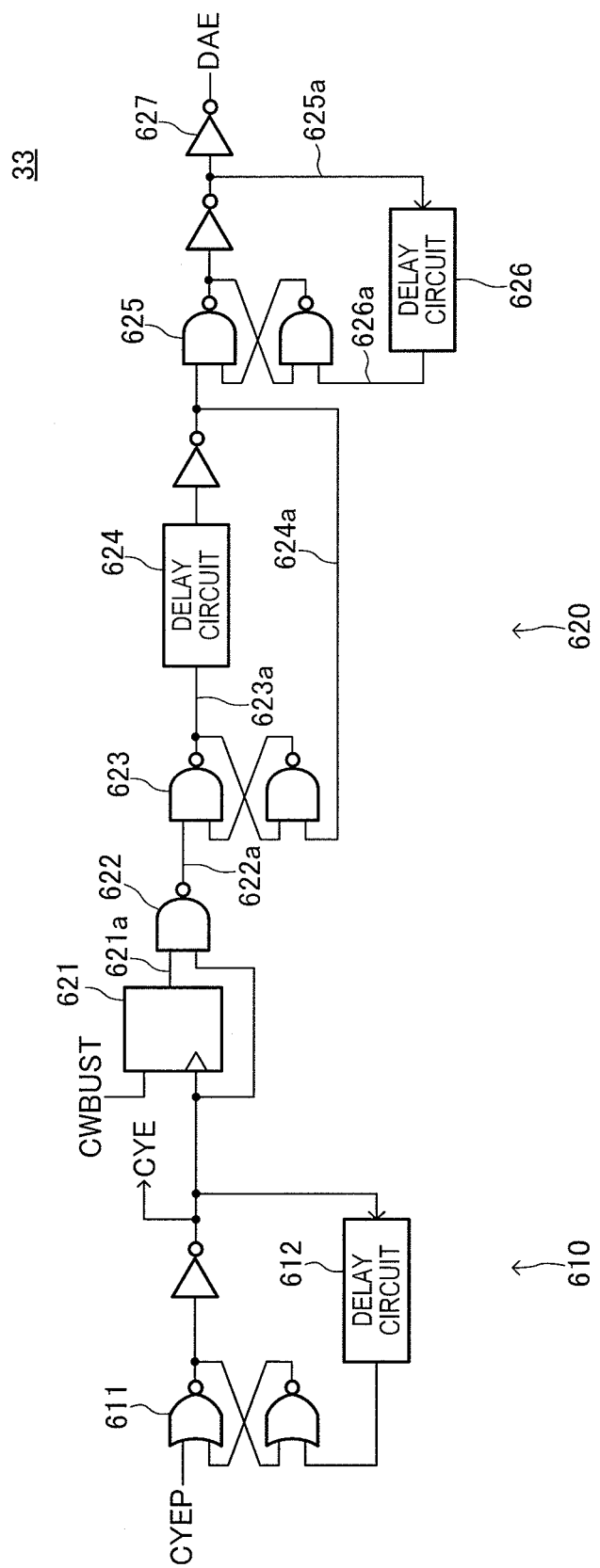
FIG. 7 is a circuit diagram of a column delay control circuit 33.

FIG. 7 is a circuit diagram of the column delay control circuit 33.

As shown in FIG. 7, the column delay control circuit 33 includes a column control signal generation unit 610 and a data amplifier control signal generation unit 620. The column control signal generation unit 610 includes an SR latch circuit 611 which is set by the column control signal CYEP, and a delay circuit 612 which delays the output of the SR latch circuit 611. The SR latch circuit 611 is reset by the output of the delay circuit 612. The output of the SR latch circuit 611 is used as the column control signal CYE.

With such a configuration, when the column control signal CYEP, a one-shot signal, is activated in a read operation or write operation, the SR latch circuit 611 is set to activate the column control signal CYE to a high level until the SR latch circuit 611 is reset by the delay circuit 612. That is, the pulse width of the column control signal CYE is determined by the amount of delay of the delay circuit 612. Here, the delay circuit 612 is composed of the same circuit as the delay circuit 100 shown in FIG. 1. Consequently, the pulse width of the column control signal CYE is affected only by characteristic variations of the N-channel MOS transistors, not by characteristic variations of the P-channel MOS transistors.

The data amplifier control signal generation unit 620 includes a latch circuit 621 which latches the read control signal CWBUST in synchronization with the column control signal CYE, and a NAND gate circuit 622 which receives the output 621a of the latch circuit 621 and the column control signal CYE. The output 622a of the NAND gate circuit 622 is supplied to an SR latch circuit 623, whereby the SR latch circuit 623 is set. The output 623a of the SR latch circuit 623 is supplied to a delay circuit 624, whose output 624a resets the SR latch circuit 623. The output 624a of the delay circuit 624 is supplied to an SR latch circuit 625, whereby the SR latch circuit 625 is set. The output 625a of the SR latch circuit 625 is supplied to a delay circuit 626, whose output 626a resets the SR latch circuit 625. The output 625a of the SR latch circuit 625 is output through an inverter 627 and used as the data amplifier control signal DAE. Here, the delay circuit 624 is composed of the same circuit as the delay circuit 100 shown in FIG. 1.

With such a configuration, when the read control signal CWBUST is activated in a read operation, the latch circuit 621 latches the read control signal CWBUST by the column control signal CYE, whereby the SR latch circuit 623 is set. The output 623a of the SR latch circuit 623 is delayed by the delay circuit 624 and output as the data amplifier control signal DAE through the SR latch circuit 625. The timing of activation of the data amplifier control signal DAE is thus determined by the amount of delay of the delay circuit 624. Here, the delay circuit 624 is the same circuit as the delay circuit 100 shown in FIG. 1. Consequently, the timing of activation of the data amplifier control signal DAE is affected only by characteristic variations of the N-channel MOS transistors, not by characteristic variations of the P-channel MOS transistors. The delay circuit 626 need not be the delay circuit according to the present invention and may be composed of an ordinary inverter chain.

The column control signal CYE and data amplifier control signal DAE thus generated are supplied to circuit blocks such as the data amplifier 71 and the precharge circuit 73 shown in FIG. 6.

Figure 8:
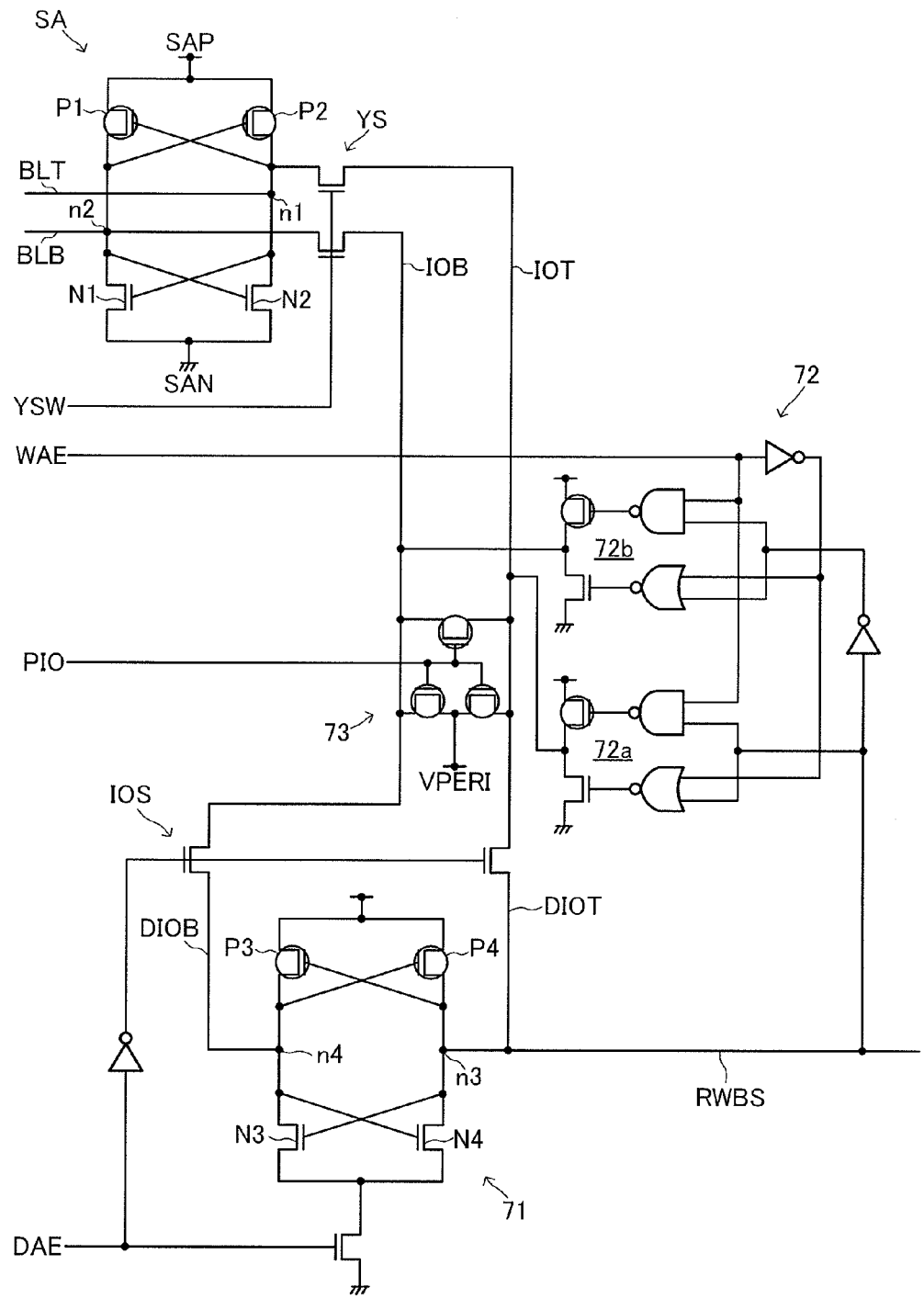
FIG. 8 is a circuit diagram of a sense amplifier SA, a data amplifier 71, a write amplifier 72, and a precharge circuit 73.

FIG. 8 is a circuit diagram of a sense amplifier SA, the data amplifier 71, the write amplifier 72, and the precharge circuit 73.

The sense amplifier SA includes cross-coupled P-channel MOS transistors P1 and P2 and cross-coupled N-channel MOS transistors N1 and N2, and has a pair of input/output nodes n1 and n2 to which a pair of bit lines BLT and BLB are connected. The input/output nodes n1 and n2 of the sense amplifier SA are connected to a pair of input/output lines IOT and IOB through column switches YS. The column switches YS are switches to be controlled by a column select signal YSW. The column select signal YSW is a signal that is synchronous with the column control signal CYE. Of the column select signals YSW assigned to the respective sense amplifiers SA, only those designated by the column address YA are activated.

The data amplifier 71 has the same circuit configuration as that of the sense amplifier SA. The data amplifier 71 includes cross-coupled P-channel MOS transistors P3 and P4 and cross-coupled N-channel MOS transistors N3 and N4, and has a pair of input/output nodes n3 and n4 to which a pair of data input/output lines DIOT and DIOB are connected. The pair of data input/output lines DIOT and DIOB are connected to the pair of input/output lines IOT and IOB through input/output switches IOS. The input/output switches IOS are switches to be controlled by the data amplifier control circuit DAE.

The write amplifier 72 includes a tristate buffer 72a which drives the input/output line IOT, and a tristate buffer 72b which drives the input/output line IOB. Both the tristate buffers 72a and 72b are activated by the write amplifier control signal WAE. Based on the logic level of write data on the read/write bus RWBS, either one of the tristate buffers 72a and 72b drives the corresponding input/output line to a high level and the other drives the corresponding input/output line to a low level.

The precharge circuit 73 is a circuit that precharges the pair of input/output lines IOT/B based on a precharge signal PIO. The precharge signal PIO is a signal that is synchronous with the column control signal CYE. When the precharge signal PIO is activated, the precharge circuit 73 precharges the pair of input/output lines IOT/B to a high level (VPERI). That is, the pair of input/output lines IOT/B are precharged to a high level (VPERI), not to an intermediate level (VARY/2) between a high level (VARY) and a low level (VSS) like the pair of bit lines BLT and BLB.

Next, the operation of the semiconductor device 10 according to the present embodiment will be described.

Figure 9:
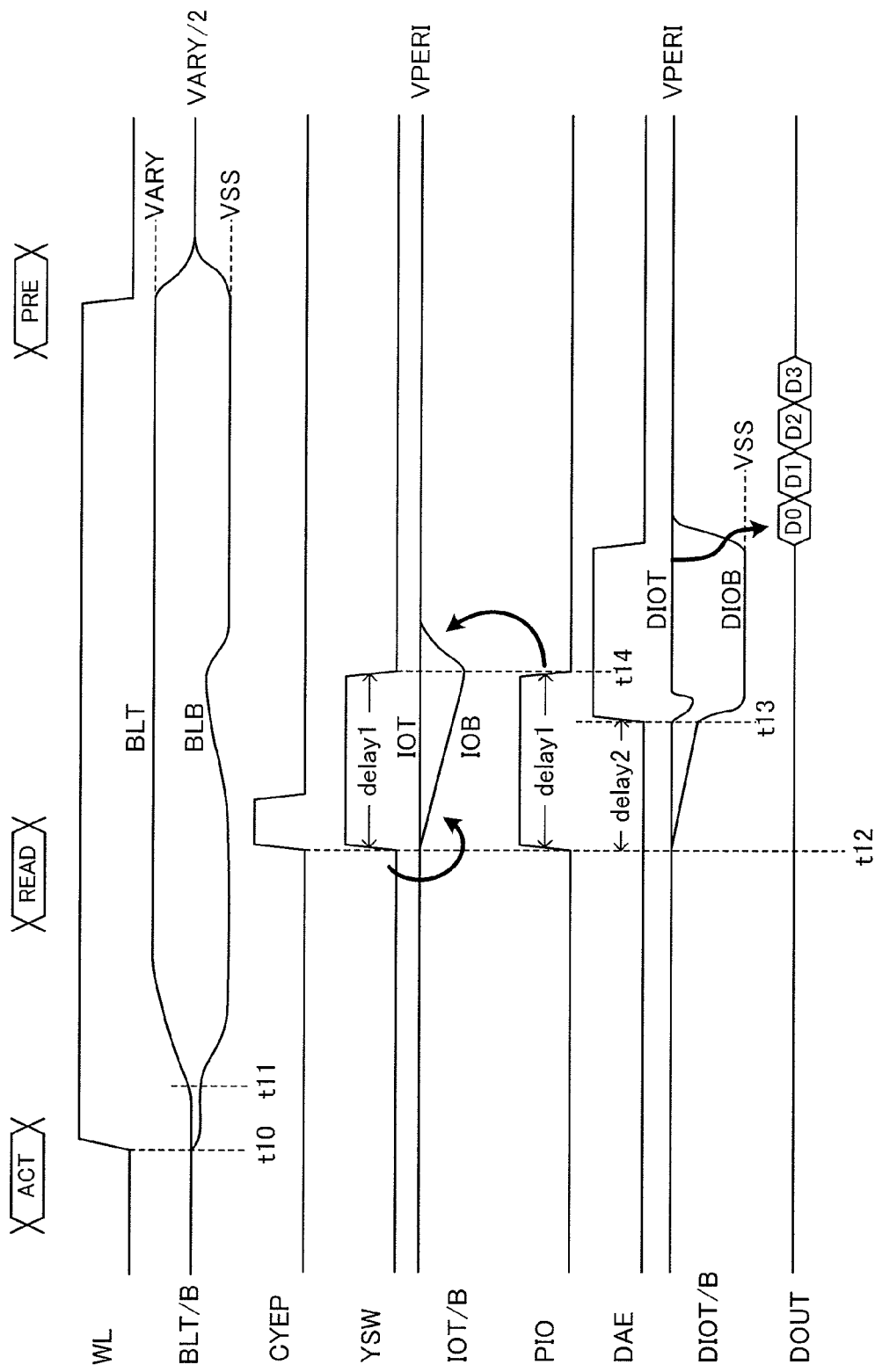
FIG. 9 is a waveform chart for explaining a read operation of the semiconductor device 10.

FIG. 9 is a waveform chart for explaining the read operation of the semiconductor device 10 according to the present embodiment.

Initially, when an active command is issued from outside, a word line WL that is designated by the row address XA is selected (time t10). The memory cell MC assigned to the word line is thereby connected to the bit line, and the pair of bit lines BLT and BLB varies in potential based on the data retained in the memory cell MC. FIG. 9 shows the case where low-level data is stored in the memory cell MC that is connected to a bit line BLB, so that the bit line BLB falls slightly in potential.

Next, the sense amplifier SA is activated to amplify the potential difference between the pair of bit lines BLT and BLB (time t11). Consequently, the bit line BLT is driven to the VARY level, and the bit line BLB is driven to the VSS level.

If a read command is issued here from outside, the one-shot column control signal CYEP is activated in response to the issuance (time t12). The column control signal CYEP is input to the column control signal generation unit 610 shown in FIG. 7, whereby the column control signal CYE is generated whose pulse width is determined by the amount of delay "delay1" of the delay circuit 612. As described previously, the column control signal CYE activates predetermined column select signals YSW based on the column address YA. Consequently, the pulse width of the column select signal YSW is determined by the amount of delay "delay1" of the delay circuit 612. The same holds true for the inactive period of the precharge signal PIO.

The pulse width of the column select signal YSW defines the timing when the column select signal YSW returned to an inactive state (time t14). In other words, the connection between the sense amplifier SA and the pair of input/output lines IOT/B is interrupted at the timing when the column select signal YSW returns to the inactive state (time t14).

As described previously, the pair of input/output lines IOT/B precharged are at the high level (VPERI). The activation of the column select signal YSW lowers the level of either one of the pair of input/output lines IOT/B. The level of the other is maintained at VPERI. Note that what makes the one of the pair of input/output lines IOT/B lower in level is the N-channel MOS transistor N1 or N2 constituting the sense amplifier SA. In the meantime, the P-channel MOS transistors P1 and P2 constituting the sense amplifier SA do not contribute to the driving of the pair of input/output lines IOT/B. This means that the rate at which one of the pair of input/output lines IOT/B decreases in level is determined by the capability of the N-channel MOS transistors in the sense amplifier SA and irrelevant to the capability of the P-channel MOS transistors in the sense amplifier SA.

When the N-channel MOS transistors vary in characteristic due to changes in temperature, voltage, and the like, it follows that the rate at which one of the pair of input/output lines IOT/B decreases in level varies. More specifically, in situations where the N-channel MOS transistors have a low driving capability, the level of one of the pair of input/output lines IOT/B decreases slowly. Conversely, in situations where the N-channel MOS transistors have a high driving capability, the level of one of the pair of input/output lines IOT/B decreases quickly. For such reason, the time needed for one of the pair of input/output lines IOT/B to decrease sufficiently in level is affected by characteristic variations of the N-channel MOS transistors due to a change in temperature, voltage, etc.

In the present embodiment, however, the timing at which the column select signal YSW returns to the inactive state (time t14) is determined by the amount of delay of the delay circuit 612. The amount of delay of the delay circuit 612 is affected only by characteristic variations of the N-channel MOS transistors. The column switches YS can thus be turned OFF at timing when one of the pair of input/output lines IOT/B is sufficiently low in level. More specifically, in situations where the level of one of the pair of input/output lines IOT/B decreases slowly, the timing at which the column select signal YSW returns to the inactive state (time t14) is automatically delayed. In situations where the level of one of the pair of input/output lines IOT/B decreases quickly, the timing at which the column select signal YSW returns to the inactive state (time t14) is automatically advanced. This makes it possible to turn OFF the column switches YS at optimum timing in any situation.

The read data thus transferred to the pair of input/output lines IOT/B is further amplified by the data amplifier 71. The timing of activation of the data amplifier 71 (time t13) is determined by the data amplifier control signal DAE. The timing of activation of the data amplifier control signal DAE (time t13) is determined by the amount of delay "delay2" of the delay circuit 624 shown in FIG. 7, and is affected by characteristic variations of the N-channel MOS transistors as in the foregoing example. This makes it possible to activate the data amplifier 71 at optimum timing in any situation.

The read data DOUT amplified by the data amplifier 71 is passed through the FIFO circuit 81 and the input/output buffer 82 shown in FIG. 6 and output from the data input/output terminal 14 to outside. When a precharge command is issued from outside, the word line WL is reset and the pair of bit lines BLT and BLB return to the precharged state.

As described above, according to the present embodiment, it is possible to control the column switches YS and the data amplifier 71 always at optimum timing even if the capability of the sense amplifier SA varies due to a change in temperature, voltage, etc.

Figure 10:
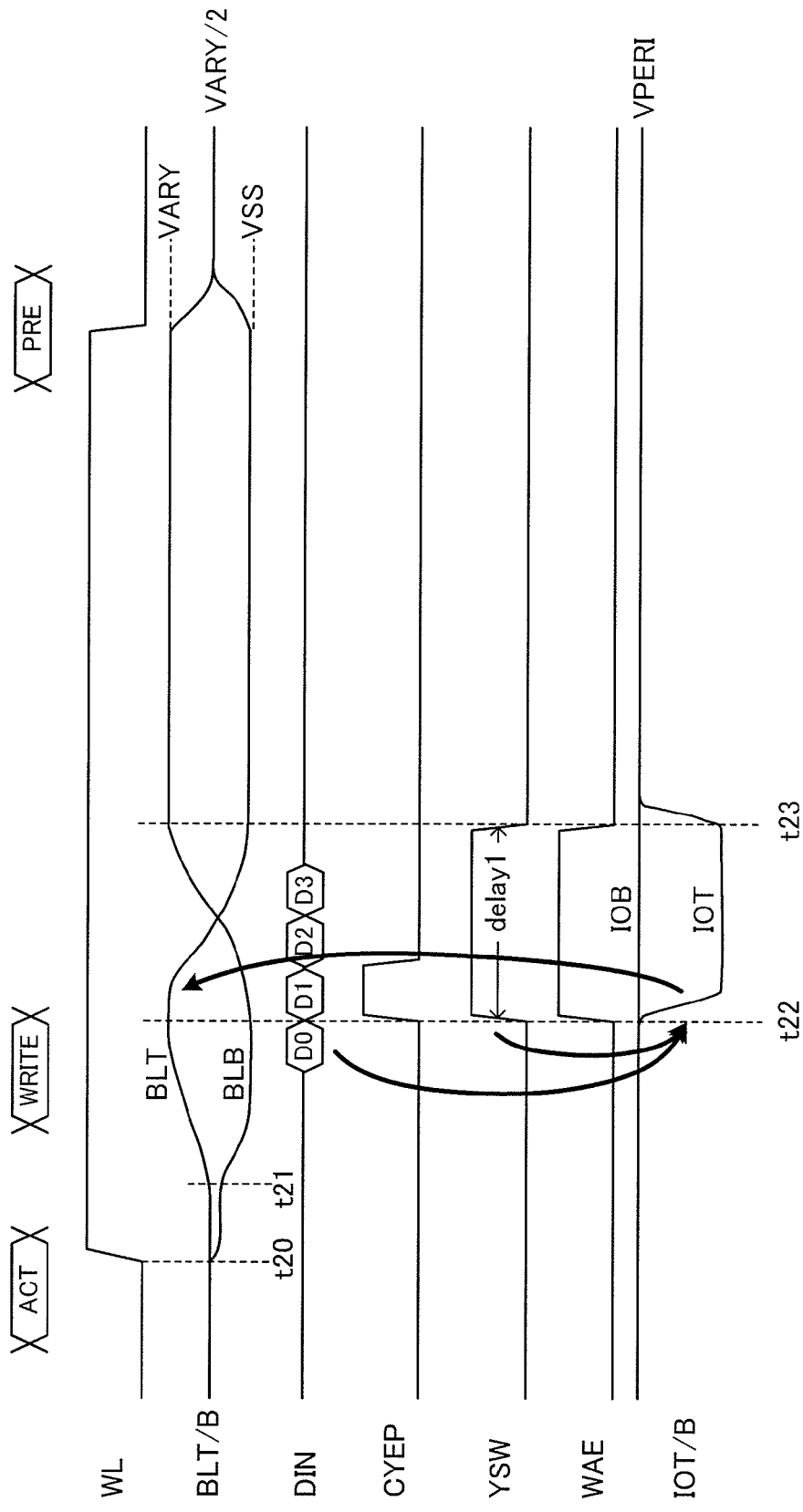
FIG. 10 is a waveform chart for explaining a write operation of the semiconductor device 10.

FIG. 10 is a waveform chart for explaining the write operation of the semiconductor device 10 according to the present embodiment.

Initially, when an active command is issued from outside, a word line WL that is designated by the row address XA is selected (time t20). Such an operation is the same as has been described with reference to FIG. 9. Next, when a write command is issued and write data DIN is input from outside, the write amplifier control signal WAE is activated and the write amplifier 72 drives the pair of input/output lines IOT/B. This overwrites the data in the sense amplifier SA. In the example shown in FIG. 10, the bit line BLT is driven to the low level, and the bit line BLB is driven to the high level. Subsequently, the column select signal YSW is deactivated, and the connection between the pair of input/output lines IOT/B and the sense amplifier SA is interrupted by the column switches YS. Again, the timing of deactivation of the column select signal YSW is determined by the amount of delay "delay1" of the delay circuit 612. When a precharge command is issued from outside, the word line WL is reset and the pair of bit lines BLT and BLB returns to the precharged state.

As has been described above, in the semiconductor device according to the present embodiment, the pair of input/output lines IOT/B are precharged to the high level. The rate at which one of the pair of input/output lines IOT/B decreases in level in a read operation is thus determined by the capability of the N-channel MOS transistors and irrelevant to the capability of the P-channel MOS transistors. Under the conditions, it is needed for the timings of changes of the column select signal YSW and the data amplifier control signal DAE to follow characteristic variations of only the N-channel MOS transistors. Since the present embodiment uses the delay circuit 100 that follows characteristic variations of only the N-channel MOS transistors, it is possible to control the column switches YS and the data amplifier 71 at proper timing without being affected by characteristic variations of the P-channel MOS transistors.

The above embodiment has dealt with the case where the pair of input/output lines IOT/B are precharged to a high level. On the other hand, when the pair of input/output lines IOT/B are precharged to a low level, the delay circuit 200 shown in FIG. 3 may be used. In such a case, the rate at which one of the pair of input/output lines IOT/B increases in level in a read operation is determined by the capability of the P-channel MOS transistors and irrelevant to the capability of the N-channel MOS transistors. The use of the delay circuit 200 shown in FIG. 3 makes it possible to control the column switches YS and the data amplifier 71 at proper timing without being affected by characteristic variations of the N-channel MOS transistors.

It is apparent that the present invention is not limited to the above embodiments, but may be modified and changed without departing from the scope and spirit of the invention.

In the foregoing embodiments, the signal lines L1 and/or L2 are provided with time constant circuits. However, the provision of the time constant circuits is not essential to the present invention. The time constant circuits, if any, are not limited to a particular circuit configuration, either. For example, resistors may be used instead of the transistor TR3. The transistors TR3 may be omitted by reducing the transistors TR1o in size so that the transistors TR1o have a current driving capability lower than that of the transistors TR2o.

The application of the delay circuit according to the present invention is not limited to the semiconductor device 10 shown in FIG. 6. The delay circuit is also applicable to various types of circuits that need to cancel characteristic variations of transistors due to changes in temperature, voltage, etc.

What is claimed is:

1. A semiconductor device comprising:
a plurality of delay elements connected in series including odd-numbered and even-numbered delay elements, each of the odd-numbered and even-numbered delay elements including a first transistor of a first conductivity type and a second transistor of a second conductivity type, each of the odd-numbered delay elements driving its output node to a first potential via the first transistor and each of the even-numbered delay elements driving its output node to a second potential different from the first potential via the second transistors when the input signal takes one of high and low levels; and
one or more third transistors of the second conductivity type, each of the third transistors driving the output node of an associated one of the odd-numbered delay elements toward the second potential when the input signal takes one of high and low levels.

2. The semiconductor device as claimed in claim 1, further comprising a plurality of resistive elements each interposed between an associated one of the third transistors and the output node of an associated one of the odd-numbered delay elements.

3. The semiconductor device as claimed in claim 2, wherein each of the resistive elements comprises a fourth transistor that is fixed to an ON state.

4. The semiconductor device as claimed in claim 1, wherein each of the first transistors has a current driving capability lower than that of each of the second transistors.

5. The semiconductor device as claimed in claim 1, further comprising a plurality of capacitive elements each connected to the output node of an associated one of the odd-numbered delay elements.

6. The semiconductor device as claimed in claim 1, further comprising a plurality of fifth transistors of the first conductivity type, wherein each of the fifth transistors drives the output node of an associated one of the even-numbered delay elements toward the first potential when the input signal takes one of high and low levels.

7. A semiconductor device comprising:
first and second voltage lines supplied with first and second voltages, respectively; and
a delay circuit that includes:
a first inversion circuit including a first input node, a first output node, a first transistor of a first conductivity type coupled between the first voltage line and the first output node, and a second transistor of a second conductivity type coupled between the second voltage line and the first output node, gates of the first and second transistors being coupled in common to the first input node; and
a third transistor of the second conductivity type coupled between the second voltage line and the first output node;
the first transistor being configured to turn on when the third transistor maintains an on-state such that a current flows between the first and second voltage lines through the first and third transistors.

8. The semiconductor device as claimed in claim 7, further comprising an additional delay circuit connected to the delay circuit, the additional delay circuit that comprises:
a second inversion circuit including a second input node coupled to the first output node, a second output node, a fourth transistor of the first conductivity type coupled between the first voltage line and the second output node, and a fifth transistor of the second conductivity type coupled between the second voltage line and the second output node, gates of the fourth and fifth transistors being coupled in common to the second input node; and
a sixth transistor of the first conductivity type coupled between the first voltage line and the second output node;
the fifth transistor being controlled to turn on when the sixth transistor maintains an on-state such that an additional current flows between the first and second voltage lines through the fifth and sixth transistors.

9. The semiconductor device as claimed in claim 7, wherein the delay circuit further comprises a seventh transistor of the first conductivity type coupled between the third transistor and the first output node.

10. The semiconductor device as claimed in claim 8, wherein the delay circuit further comprises a seventh transistor of the first conductivity type coupled between the third transistor and the first output node and the additional delay circuit further comprises an eighth transistor of the second conductivity type coupled between the sixth transistor and the second output node.

11. The semiconductor device as claimed in claim 7, wherein the first conductivity type is of an N conductivity type and the second conductivity type is of a P conductivity type.

12. The semiconductor device as claimed in claim 7, wherein the first conductivity type is of a P conductivity type and the second conductivity type is of an N conductivity type.

13. The semiconductor device as claimed in claim 7, wherein a gate of the third transistor is coupled to the first voltage line.

14. The semiconductor device as claimed in claim 8, wherein a gate of the third transistor is coupled to the first voltage line and a gate of the sixth transistor is coupled to the second voltage line.

15. A semiconductor device comprising:
first and second voltage lines supplied with first and second voltages, respectively; and
a delay circuit that includes:
a first inversion circuit including a first input node, a first output node, a first transistor of a first conductivity type coupled between the first voltage line and the first output node, and a second transistor of a second conductivity type coupled between the second voltage line and the first output node, gates of the first and second transistors being coupled in common to the first input node;
a second inversion circuit including a second input node coupled to the first output node, a second output node, a third transistor of the first conductivity type coupled between the first voltage line and the second output node, and a fourth transistor of the second conductivity type coupled between the second voltage line and the second output node, gates of the third and fourth transistors being coupled in common to the second input node; and
a fifth transistor of the second conductivity type coupled between the second voltage line and the second input node, a gate of the fifth transistor being coupled to the first voltage line to receive the first voltage and separated from the first input node of the first inversion circuit.

16. The semiconductor device as claimed in claim 15, wherein the first conductivity type is of an N conductivity type and the second conductivity type is of a P conductivity type.

17. The semiconductor device as claimed in claim 15, wherein the first conductivity type is of a P conductivity type and the second conductivity type is of an N conductivity type.

18. The semiconductor device as claimed in claim 15, wherein the delay circuit further comprises a sixth transistor of the first conductivity type coupled between the first output node and the second input node.

19. The semiconductor device as claimed in claim 15, further comprising one or more additional delay circuits each being the same in circuit configuration as the delay circuit, the delay circuit and the one or more additional delay circuits being connected in series.

* * * * *